United States Patent Office
3,574,617
Patented Apr. 13, 1971

3,574,617

NOVEL PHOTOSENSITIVE COATING SYSTEMS

Martin Skoultchi, Somerset, N.J., assignor to National Starch and Chemical Corporation, New York, N.Y.

No Drawing. Continuation-in-part of application Ser. No. 626,945, Mar. 30, 1967, now Patent No. 3,429,852. This application Mar. 4, 1968, Ser. No. 709,969
The portion of the term of the patent subsequent to Feb. 25, 1986, has been disclaimed
Int. Cl. G03c *1/68*
U.S. Cl. 96—35.1 24 Claims

ABSTRACT OF THE DISCLOSURE

Photosensitive coating systems prepared by the deposition, upon a solid substrate, of an organic solvent solution or aqueous emulsion of a copolymer containing moieties derived from a particular class of ethylenically unsaturated benzophenone derivatives; the presence of said moieties rendering the resulting polymer coating sensitive to ultra-violet or visible light which affects the crosslinking, or insolubilization, of the thus exposed coatings. The latter photosensitive coating systems are particularly suitable for use in various applications such, for example, as in the lithographic and chemical milling fields.

RELATED APPLICATION

This application is a continuation-in-part of application Ser. No. 626,945, filed Mar. 30, 1967, now Pat. No. 3,429,852 and assigned to the same assignee as the subject application.

BACKGROUND OF THE INVENTION

As is well known to those skilled in the art, there are a variety of photosensitive polymers capable of being insolubilized, by means of a crosslinking reaction, upon their exposure to actinic radiation and which are, accordingly, employed in the preparation of products which take direct advantage of this unique property. Thus, such photosensitive polymers are used in preparing coating systems employed in the printing industry. For example, upon being coated upon a suitable substrate, the resulting photosensitive plate can be exposed to a light source through an image bearing transparency consisting of opaque and transparent areas. Thereafter, the unexposed areas of the plate are removed by washing with water or a suitable solvent so as to leave behind a positive image consisting of the exposed areas of the plate which are now in the form of an insolubilized, i.e. crosslinked, polymer. Such plates may then be used to reproduce the image of the original transparency in any number of applicable printing processes.

Also of great interest is the use of these photosensitive polymers in so called chemical milling or photoresist operations wherein the polymer is coated upon both surfaces of a metal plate and the resulting coatings are each thereafter exposed, through a negative, to a suitable light source. After washing off the uncrosslinked polymer with a suitable solvent, those areas of the metal plate which are not protected by the exposed, crosslinked polymer coating are etched away with an appropriate etchant. The latter technique is rapidly gaining wide spread acceptance in many areas requiring the precision working of thin sections of metals.

There are, however, certain drawbacks and disadvantages inherent in many of the presently available photosensitive coating systems which have tended to curtail their utilization in industrial applications. Thus, for example, some photosensitive polymers are extremely unstable and cannot be applied to substrates which are to be used at a later date. Such photosensitive polymers must, therefore, be coated upon substrates by the ultimate user immediately prior to the time at which they are to be used. Needless to say, the latter requirement is a great inconvenience inasmuch as it often leads to poor results on the part of an individual who lacks the necessary skills and equipment for the adequate preparation of these products.

In addition, many presently available photosensitive coating systems are characterized by their relative insensitivity, i.e. their need for lengthy exposure periods, which precludes their use in many automated processes wherein a rapid exposure period is mandated. And, still another poor feature of certain of these photosensitive polymers is their requirement for thermal curing so as to be able to develop satisfactory resistance to certain etching solutions which are used in chemical milling operations.

It is, thus, the prime object of this invention to provide novel photosensitive coating systems for use in various printing and chemical milling applications, said coating systems being characterized by their outstanding stability, their sensitivity and their ability to be used in the absence of a thermal curing step.

DETAILED DESCRIPTION OF THE INVENTION

It has now been found that by the use of polymers derived from certain ethylenically unsaturated derivatives of benzophenone, it is possible to prepare photosensitive coating systems which are devoid of many of the deficiencies heretofore encountered in the currently available products of this type.

Thus, the novel photosensitive coating systems of this invention comprise a solid substrate coated on at least one surface thereof with the dry residue of an organic solvent solution or aqueous emulsion of a polymer containing moieties derived from an ethylenically unsaturated derivative of a substituted benzophenone selected from the group consisting of:

(1)

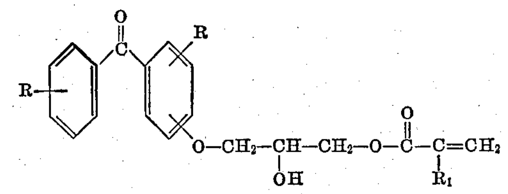

and, (2)

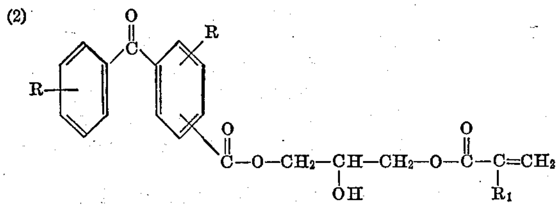

wherein R is a radical selected from the group consisting of the hydrogen, alkyl and aryl radicals and $R_1$ is a radical selected from the group consisting of the hydrogen and methyl radicals.

As representative of the above described ethylenically unsaturated derivatives of substituted benzophenones, one may list the following compounds all of which may be characterized as being either ethers or esters of a substituted benzophenone:

(2-hydroxy-3-methacryloxy)propyl ortho-benzoylbenzoate;
(2-hydroxy-3-acryloxy)propyl ortho-benzoylbenzoate;
(2-hydroxy-3-methacryloxy)propyl para-benzoylbenzoate;
(2-hydroxy-3-acryloxy)propyl para-benzoylbenzoate;
(2-hydroxy-3-methacryloxy)propoxy ortho-benzoylbenzene;
(2-hydroxy-3-acryloxy)propoxy ortho-benzoylbenzene;
(2-hydroxy-3-methacryloxy)propoxy para-benzoylbenzene;
(2-hydroxy-3-acryloxy)propoxy para-benzoylbenzene;
(2-hydroxy-3-methacryloxy)propyl ortho(o′-methylbenzoyl)benzoate;
(2-hydroxy-3-acryloxy)propyl ortho(o′-methylbenzoyl)benzoate;
(2-hydroxy-3-methacryloxy)propyl ortho-(m′-methylbenzoyl)benzoate;
(2-hydroxy-3-acryloxy)propyl ortho-(m′-methylbenzoyl)benzoate;
(2-hydroxy-3-methacryloxy)propyl ortho-(p′-methylbenzoyl)benzoate;
(2-hydroxy-3-acryloxy)propyl ortho-(p′-methylbenzoyl)benzoate;
(2-hydroxy-3-methacryloxy)propoxy para-(o′-methylbenzoyl)benzene;
(2-hydroxy-3-acryloxy)propoxy para-(o′-methylbenzoyl)benzene;
(2-hydroxy-3-methacryloxy)propoxy para-(m′-methylbenzoyl)benzene;
(2-hydroxy-3-acryloxy)propoxy para-(m′-methylbenzoyl)benzene;
(2-hydroxy-3-methacryloxy)propoxy para-(p′-methylbenzoyl)benzene;
(2-hydroxy-3-acryloxy)propoxy para-(p′-methylbenzoyl)benzene;
(2-hydroxy-3-methacryloxy)propyl ortho-benzoyl-para-methylbenzoate;
(2-hydroxy-3-acryloxy)propyl ortho-benzoyl-para-methylbenzoate;
(2-hydroxy-3-methacryloxy)propoxy ortho-methyl-para-benzoylbenzene; and,
(2-hydroxy-3-acryloxy)propoxy ortho-methyl-para-benzoylbenzene.

The polymers applicable for use in these novel photosensitive coating systems comprise copolymers containing moieties derived from at least one of the above described benzophenone derivatives together with moieties derived from one or more conventional, i.e. devoid of benzophenone groups, ethylenically unsaturated, i.e. vinyl, monomers such for example as styrene; alpha-methyl styrene; the acrylic and methacrylic acid esters of aliphatic alcohols such as methyl, ethyl, propyl, butyl, isobutyl, amyl, hexyl, 2-ethyl hexyl, octyl, lauryl, and stearyl alcohols; acrylic acid, methacrylic acid; isoprene; acrylamide; methacrylamide, acrylonitrile; methacrylonitrile; butadiene; vinyl propionate; dibutyl fumarate; dibutyl maleate; diallyl phthalate; vinylidene chloride; vinyl chloride; vinyl fluoride; and vinyl acetate etc. Any of these monomers may be used either alone or in combination with one another together with one or more of the benzophenone containing monomers.

The synthesis of the ethylenically unsaturated derivatives of a substituted benzophenone which are utilized in preparing these polymers applicable for use in these novel photosensitive coating sensitive coating systems involves the catalyzed reaction of either glycidyl acrylate or methacrylate with a benzophenone compound corresponding to the formulae:

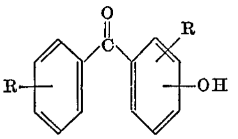

and

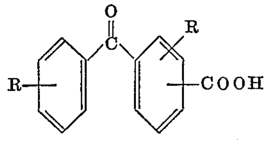

wherein R is as defined hereinabove.

As representative of the above described substituted benzophenone intermediates, one may list the following compounds:

ortho-benzoylbenzoic acid, i.e.

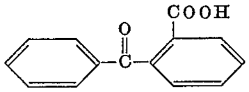

meta-benzoylbenzoic acid, i.e.

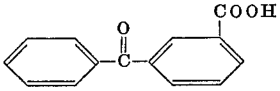

para-benzoylbenzoic acid, i.e.

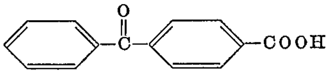

ortho-hydroxybenzophenone, i.e.

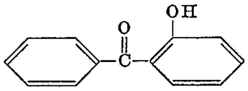

meta-hydroxybenzophenone, i.e.

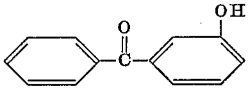

para-hydroxybenzophenone, i.e.

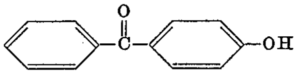

ortho-(p′-methylbenzoyl)benzoic acid, i.e.

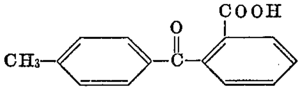

p′-methyl-para-hydroxybenzophenone, i.e.

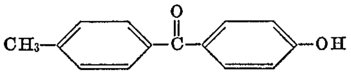

ortho-benzoyl-para-methyl benzoic acid, i.e.

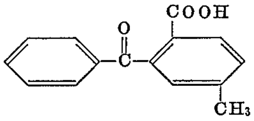

and

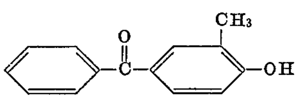

Further details relating to the preparation of these monomeric benzophenone derivatives may be obtained from a reading of copending application, Ser. No. 626,945, filed Mar. 30, 1967 and assigned to the assignee of the subject application, a copy of said specification being made a part hereof.

In utilizing these ethylenically unsaturated benzophenone derivatives in the preparation of copolymers suitable for use in these coating systems, there may be employed any of the usual vinyl polymerization methods which are well known to those skilled in the art and which is particularly suited for the copolymer whose preparation is desired. Thus, such polymers may be prepared by means of free radical initiated processes utilizing bulk, suspension, solution, or emulsion polymerization techniques; or, they may be prepared by ionic catalysis or by means of stereospecific catalysts such as those of the type developed by Ziegler.

However, inasmuch as it is far more convenient, in the process of this invention, to utilize these copolymers in the form of their organic solvent solutions, it is accordingly preferable to prepare them by means of a free radical initiated, solution polymerization technique in an organic solvent medium consisting of one or more of such solvents as ethyl acetate, isopropanol, and 2-butanone. Again further details relating to the preparation of the copolymers applicable for use in our photosensitive coating system may be obtained from the above noted copending application.

In order to effectively crosslink and insolubilize upon exposure to ultra-violet and visible light, the copolymers applicable for use in the photosensitive coating systems of this invention should contain from about 0.1 to 50%, by weight, of moieties derived from at least one of these ethylenically unsaturated benzophenone derivatives. When the concentration of ethylenically unsaturated benzophenone derivative substantially exceeds about 50%, by weight, the crosslinking efficiency of the copolymer is markedly decreased because of the reduced concentration, in the copolymer, of the moieties derived from the conventional monomers.

In utilizing these photosensitive copolymers in the preparation of the coating systems of this invention, it is preferable, as noted earlier, that they be in the form of lacquers, i.e. organic solvent solutions, although aqueous emulsions of these copolymers may also be used if so desired. The resin solids content of these solutions or emulsions should, preferably, be in the range of from about 5 to 80%, by weight.

It is often desirable, although not essential, to introduce various additives into the solution or emulsion of these photosensitive copolymers in order to increase their sensitivity to light. Suitable additives of this type, which are referred to as photosensitizers include phenanthrenequinone; 2-methylanthaquinone; 1,4- and 1,2-naphthoquinone; 1,4-benzoquinone dibenzoylnaphthalene benzophenone; tetramethyldiaminobenzophenone; acetophenone; benzaldehyde 2- or 9-acetylphenanthrene; benzoyl peroxide and, any of the halogenated, nitrated, or sulfonated or alkylated derivatives of the latter reagents. The latter class of additives may be utilized in concentration of from about 0.01 to 10%, as based on the weight of copolymer resin solids.

It is also possible to admix these photosensitive polymers with up to about 50%, by weight, of their resin solids, of a previously prepared conventional, i.e. light inactive, polymer such, for example, as poly(n-butyl methacrylate), poly(iso-butyl methacrylate) or a copolymer of n-butyl and isobutyl methacrylate, etc. Thus, the addition of the latter polymers does not result in the loss of any light sensitivity on the part of the photosensitive polymer and they may, therefore, be utilized as low cost extenders for these more costlier materials.

Other possible additives include non-polymeric, organic or inorganic fillers or reinforcing agents, which form essentially transparent compositions, e.g. the organophilic silicas, the bentonites, silica, powdered glass, and the like. Similarly, dyes and pigments which do not appreciably absorb light at the wavelength being used for exposure can be admixed with the photosensitive polymer. Suitable dyes include Fuchsine (CI 42510), Calcocid Green S (CI 44090), Solvent Yellow 34 (CI 4100B), etc. Suitable pigments include titanium dioxide, colloidal carbon, graphite, ceramics, clays, phosphor particles and metal particles, e.g. aluminum magnetic iron, copper, etc.

The actual preparation of these photoconductive coating systems involves the initial step of coating one or both surfaces of a selected solid substrate with a lacquer or emulsion of the photosensitive copolymer. Any suitable coating technique may be employed while applicable substrates include paper, paperboard, fiberglass sheets, metal sheets and foils, e.g. copper, aluminum, zinc, and steel, etc.; glass plates; films or plates composed of various film forming synthetic resins including the homo- and copolymers of ethylene, propylene, vinyl chloride, vinylidene chloride, vinyl acetate, styrene, isobutylene, and acrylonitrile; polyvinyl acetal; polyethylene terephthalate; polyamides and, cellulose esters such as cellulose acetate and cellulose butyrate. The latter polymeric substrates may contain fillers or reinforcing agents such as the various synthetic, natural or modified fibers such, for example as cellulosic fibers, e.g. cotton, cellulose acetate, viscose rayon, and paper; glass; and, polyamide fibers. These reinforced substrates may be used in laminated form.

The coating of the photosensitive polymer should be applied to the substrate so that upon drying its thickness will be in the range of from about 0.05 to 10 mils. It should be noted that the thickness of the photosensitive layer is a direct function of the thickness desired in the relief image and this will depend on the subject being reproduced and particularly on the extent of the nonprinting areas. Drying of the wet polymer coating may be achieved by air drying or by the application of any other particular drying technique whose use is favored by the practitioner. The now complete photosensitive coating system may be stored for prolonged periods to its ultimate utilization.

In using these systems, their photosensitive polymer coatings can be insolubilized to form printing elements or chemically milled metal surfaces by being exposed to actinic radiation through an image bearing transparency consisting of substantially opaque and transparent areas. Suitable sources of actinic radiation include carbon arcs, mercury-vapor arcs, fluorescent lamps with special ultraviolet light emitting phosphors, argon glow lamps, tungsten lamps and photographic flood lamps. Of these, the mercury-vapor arcs, particularly the sun lamp type and the fluorescent sun lamps are most suitable. The precise time required for the exposure of one of the novel photosensitive coating systems of this invention will be dependent upon a variety of factors which include, for example, the copolymer being utilized in the coating, thickness of the coating, the presence of a photosensitizer, the type of light source and its distance from the coating.

Subsequent to their exposure, the photosensitive coatings are "developed" by being washed with a suitable solvent such as perchloroethylene, methylene chloride, ethylene dichloride, methyl ethyl ketone, n-propanol, toluene, benzene and ethyl acetate which serves to remove that portion of the coating which was not exposed to the actinic radiation. The solvent liquid used for this operation must be selected with care since it should have good solvent action on the unexposed areas, yet have little action upon either the insolubilized copolymer or the substrate. The developing solvent should be allowed to remain in contact with the coating for a period of from about 30 seconds to 3 minutes depending upon the particular solvent being utilized. The thus developed polymer coating should next be rinsed with fresh solvent and thereupon dried.

The novel photosensitive coating systems of this invention which have been prepared, exposed and developed in the manner described hereinabove are suitable for use in a wide variety of applications with the particular coating system to be chosen for a particular application being dependent primarily upon the substrate employed in its preparation. Thus, our coating systems may be used in photography, photomechanical reproductions, lithography and intaglio printing. More specific examples of such uses are offset printing, silk screen printing, duplicating pads, manifold stencil sheeting coatings, lithographic plates, relief plates, gravure plates, photoengraving, collotype and planographic type elements, magenta screens, screen stencils, dyable images of the halftone and continuous type, in direct positive and negative systems utilizing wet development which incorporate color formers and coupling agents in vapor developed systems which incorporate diazonium salts and coupling agents. For the purposes of this disclosure, the term "printing plates" as used in the claims is meant to encompass all of the latter types of end use applications.

The printing plates made in accordance with the coating systems of this invention can be used in all types of printing but are particularly suitable for use in those procedures wherein a distinct difference of height is required between the printing and non-printing areas. Such procedures include those wherein the ink is carried by the raised portion of the plate as in dry-offset printing and ordinary letterpress printing. Such plates are also useful in processes wherein the ink is carried by the recessed portions of the plate such as in intaglio printing, e.g. line and inverted halftone. Moreover, they are also useful in multicolor printing.

As noted earlier, these photosensitive coating compositions are also suitable for carrying out chemical milling type operations such, for example, as in the preparation of ornamental plaques or for producing ornamental effects; as patterns for automatic engraving machines, foundry molds, cutting and stamping dies, name stamps, relief maps for braille, as rapid cure coatings, e.g. on film base; as television phosphor photobinders, as variable area sound tracks on film; for embossing plates, paper, e.g. with a die prepared from the photosensitive coating; and, particularly in the preparation of photo-resists, e.g. printed circuit resists, and other plastic articles.

The following examples will further illustrate the embodiment of this invention. In these examples, all parts given are by weight unless otherwise noted.

EXAMPLE I

This example illustrates the preparation and use, in a printing operation, of one of the novel photosensitive coating systems of this invention.

Following the polymerization procedure outlined in Example VI of the above noted copending application, we prepared a 40:60 (2-hydroxy-3-methacryloxy) propyl orthobenzoylbenzoate:isobutyl methacrylate solution copolymer in a solvent system comprising a 75:25 benzene: methylene chloride mixture. The resin solids content of the latter lacquer was reduced to a level of 10%, by weight, by the addition of a sufficient quantity of 2-butanone and a concentration of phenanthrenequinone equal to 2% of the weight of the copolymer resin solids was then added.

A bimetallic lithographic plate consisting of an electrodeposited film of copper over an aluminum substrate was then washed with acetone whereupon the lacquer was dip coated onto the copper surface of the plate so as to yield a film which upon drying had a thickness of 0.2 mil. This photosensitive coating was exposed, through a halftone negative mounted on a conventional vacuum frame, to the light from a General Electric RS sunlamp positioned at a distance of 12 inches from the frame. The minimum exposure time necessary to obtain the desired degree of crosslinking was 45 seconds.

After exposure, the plate was developed by covering it with perchloroethylene which acted as a solvent for the uncrosslinked copolymer. The latter solvent was gently spread over the copolymer coating with a cotton swab. The development step was allowed to proceed for a period of about ½ to 1 minutes. After rinsing with fresh perchloroethylene and drying, the copper surface that had been exposed by the removal of the uncrosslinked polymer, i.e. the areas corresponding to the opaque areas of the negative were etched away using an aqueous solution of ferric nitrate having a density of about 1.5. The areas protected by the insolubilized polymer coating were completely unaffected by the etch solution whereas those which were devoid of the protective crosslinked copolymer coating were dissolved away so as to expose the aluminum substrate.

After being washed with water and dried, the resulting image on the plate was found to be of the opposite photographic sign to that of the original negative. This plate was then run upon a lithographic type press in the conventional manner and yielded excellent reproductions. Thus, the quality of the image was such that dots smaller than 40 microns in size could be easily obtained. Subsequent to the press run, the residual crosslinked polymer coating can, if desired, be removed by gentle rubbing with a powerful solvent such as ethylene glycol monoethyl ether acetate.

In a repetition of the above described procedure, the exposure time was, in this instance, increased to 10 minutes and the negative utilized was a conventional 2 step wedge which is available in the form of the Graphic Arts Technical Foundation, i.e. the G.A.T.F., sensitivity guide. After development, insolubilization to Step 13 on the latter guide was observed.

EXAMPLE II

This example illustrates the preparation and subsequent use of one of the novel photosensitive coating systems of this invention in a chemical milling procedure.

Following the polymerization procedure outlined in Example VI of the above noted copending application, we prepared a 30:70 (2-hydroxy-3-methacryloxy) propyl orthobenzoylbenzoate:n-butyl methacrylate solution copolymer in a solvent system comprising a 75:25 benzene: methylene chloride mixture. The resin solids content of the latter lacquer was then reduced to a level of 10%, by weight, by the addition of a sufficient quantity of 2-butanone.

A film of the above described copolymer lacquer having a dry thickness of 0.25 mil was coated upon both surfaces of a cleaned and grained aluminum plate having a thickness of 0.01 inch. This plate was exposed on both surfaces through a dot negative wherein the dots were present as opaque areas on a transparent background. The light source utilized for the exposure was a 275 watt sunlamp which was placed at a distance of 12 inches from the sample. After a 3 minutes exposure of each surface of the plate, the uncrosslinked copolymer was removed by gently spraying methylene chloride over each surface thus leaving behind only the crosslinked portions of the copolymer coating in the form of a resist stencil. After drying the now exposed areas of the aluminum plate were dissolved away using a conventional lithographic etching solution for aluminum. At the completion of this etching procedure, the areas of the plate corresponding to the opaque dots upon the negative were now observed to be in the form of very fine holes on the plate's surface.

EXAMPLE III

This example illustrates the preparation and use of a number of the photosensitive coating systems of this invention which were based, respectively, upon a variety of different photosensitive copolymers.

Table I, hereinbelow provides relevant data relating to the various photosensitive copolymer lacquers which were prepared by means of the polymerization procedure set forth in Example VI of the above noted copending application. These copolymer lacquers were then diluted and coated upon a number of the bimetallic lithographic plates of the type described in Example I hereinabove. In Table II, there is set forth the pertinent data relating to the respective film thicknesses, light sources and their exposure times, distance from the coating, developer solutions, and development times which were utilized in the preparation and development of the coating systems prepared with each of the copolymers described in Table I.

TABLE I.—PARTS

| | Copolymer lacquer number | | | | | | | | | |
|---|---|---|---|---|---|---|---|---|---|---|
| | 1 | 2 | 3 | 4 | 5 | 6 | 7 | 8 | 9 | 10 |
| (2-hydroxy-3-methacryloxy)propyl ortho-benzoylbenzoate | 30 | 15 | 9 | 1 | | | | | | |
| (2-hydroxy-3-methacryloxy)propoxy para-benzoylbenzene | | | | | 30 | | | | | |
| (2-hydroxy-3-methacryloxy)propyl ortho- (p'-methylbenzoyl) benzoate | | | | | | 10 | | | | |
| (2-hydroxy-3-acryloxy)propyl para-benzoylbenzoate | | | | | | | 5 | 5 | 5 | 5 |
| Ethyl acrylate | 30 | 45 | 51 | 59 | | 50 | | 95 | | |
| Methyl acrylate | | | | | 30 | | 45 | | | |
| n-Butyl acrylate | | | | | | | | | 95 | |
| Isobutyl methacrylate | | | | | | | | | | 95 |
| Ethyl acetate | 60 | 120 | 120 | 120 | 60 | 120 | 100 | 150 | 150 | 150 |
| Isopropanol | 60 | | | | 60 | | | | | |
| Final resin solids content, percent | 32.8 | 32.9 | 33.0 | 33.0 | 32.1 | 32.8 | 32.9 | 39.9 | 39.7 | 39.6 |
| Coating thickness, mils | 0.2 | 0.2 | 0.2 | 0.2 | 0.2 | 0.2 | 0.2 | 0.2 | 0.2 | 0.2 |
| Light source [1] | B | B | A | A | A | A | A | A | A | A |
| Distance from coating, inches | 6 | 6 | 12 | 12 | 12 | 12 | 12 | 12 | 12 | 12 |
| Time of exposure, minutes | 10 | 10 | 5 | 5 | 5 | 5 | 5 | 5 | 5 | 5 |
| Developer solvent [2] | A | A | B | B | B | B | C | C | C | C |
| Step insolubilized to on the G.A.T.V. guide | 4 | 5 | 7 | 2 | 4 | 6 | 5 | 2 | 3 | 1 |

[1] Light source: A=275-watt General Electric sunlamp; B=30-watt black light fluorescent lamp.
[2] Solvent: A=perchloroethylene; B=methylene chloride; C=2-butanone.

In a repetition of the above procedure, copolymer lacquer #1 was modified by the substitution, in turn, of 30 parts of each of the below listed comonomers for the 30 parts of ethyl acrylate initially contained therein. The thus substituted comonomers were: Styrene, vinyl chloride, acrylic acid and dibutyl maleate.

Summarizing, this invention is thus seen to provide the practitioner with a novel class of photosensitive coating systems based upon copolymers containing moieties derived from a particular class of ethylenically unsaturated benzophenone derivatives. Variations may be made in procedures, materials and proportions without departing from the scope of this invention which is limited only by the following claims.

What I claim is:

1. A photosensitive coating system comprising a solid substrate coated on at least one surface thereof with a coating composition comprising a copolymer containing moieties derived from at least one vinyl monomer and at least one ethylenically unsaturated derivative of a substituted benzophenone selected from the group consisting of:

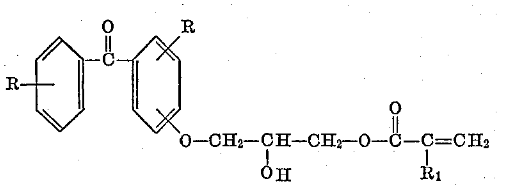

and

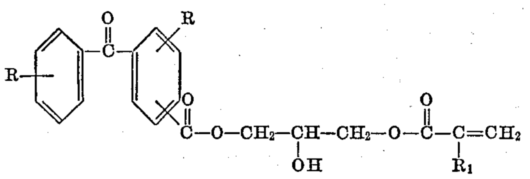

wherein R is a radical selected from the group consisting of the hydrogen, alkyl and aryl radicals and $R_1$ is a radical selected from the group consisting of the hydrogen and methyl radicals.

2. The photosensitive coating system of claim 1, wherein said ethylenically unsaturated derivative of a substituted benzophenone is selected from the group consisting of:

(2-hydroxy-3-methacryloxy)propyl ortho-benzoylbenzoate;
(2-hydroxy-3-acryloxy)propyl ortho-benzoylbenzoate;
(2-hydroxy-3-methacryloxy)propyl para-benzoylbenzoate;
(2-hydroxy-3-acryloxy)propyl para-benzoylbenzoate;
(2-hydroxy-3-methacryloxy)propoxy ortho-benzoylbenzene;
(2-hydroxy-3-acryloxy)propoxy ortho-benzoylbenzene;
(2-hydroxy-3-methacryloxy)propoxy para-benzoylbenzene;
(2-hydroxy-3-acryloxy)propoxy para-benzoylbenzene;
(2-hydroxy-3-methacryloxy)propyl ortho-(o'-methylbenzoyl)benzoate;
(2-hydroxy-3-acryloxy)propyl ortho-(o'-methylbenzoyl) benzoate;
(2-hydroxy-3-methacryloxy)propyl ortho-(m'-methylbenzoyl)benzoate;
(2-hydroxy-3-acryloxy)propyl ortho-(m'-methylbenzoyl) benzoate;
(2-hydroxy-3-methacryloxy)propyl ortho-(p'-methylbenzoyl)benzoate;
(2-hydroxy-3-acryloxy)propyl ortho-(p'-methylbenzoyl) benzoate;
(2-hydroxy-3-methacryloxy)propoxy para-(o'-methylbenzoyl)benzene;
(2-hydroxy-3-acryloxy)propoxy para-(o'-methylbenzoyl) benzene;
(2-hydroxy-3-methacryloxy)propoxy para-(m'-methylbenzoyl)benzene;
(2-hydroxy-3-acryloxy)propoxy para-m'-methylbenzoyl) benzene;
(2-hydroxy-3-methacryloxy)propoxy para-(p'-methylbenzoyl)benzene;
(2-hydroxy-3-acryloxy)propoxy para-(p'-methylbenzoyl) benzene;
(2-hydroxy-3-methacryloxy)propyl ortho-benzoyl-para-methylbenzoate;
(2-hydroxy-3-acryloxy)propyl ortho-benzoyl-para-methylbenzoate;
(2-hydroxy-3-methacryloxy)propoxy ortho-methyl-para-benzoylbenzene; and
(2-hydroxy-3-acryloxy)propoxy ortho-methyl-para-benzoylbenzene.

3. The photosensitive coating system of claim 1, wherein said copolymer contains from about 0.1 to 50%, by weight, of moieties derived from at least one of said ethylenically unsaturated derivatives of a substituted benzophenone.

4. The photosensitive coating system of claim 1, wherein said vinyl monomer is selected from the group consisting of styrene, alpha-methyl styrene, the acrylic and methacrylic esters of aliphatic alcohols, acrylic acid, methacrylic acid, isoprene, acrylamide, methacrylamide, acrylonitrile, methacrylonitrile, butadiene, vinyl propionate, dibutyl fumarate, dibutyl maleate, diallyl phthalate, vinylidene chloride, vinyl chloride, vinyl fluoride, and vinyl acetate.

5. The photosensitive coating system of claim 1, wherein a photosensitizer is present therein in a concentration of from about 0.01 to 10%, by weight, of the copolymer resin solids.

6. A photosensitive coating system comprising a solid substrate coated on at least one surface thereof with a coating comprising a (2-hydroxy-3-methacryloxy)propyl ortho-benzoylbenzoate:isobutyl methacrylate copolymer.

7. A photosenstive coating system comprising a solid substrate coated on at least one surface thereof with a coating comprising a (2-hydroxy-3-methacryloxy)propyl ortho-benzoylbenzoate:n-butyl methacrylate copolymer.

8. A photosensitive coating system comprising a solid substrate coated on at least one surface thereof with a coating comprising a (2-hydroxy-3-methacryloxy)propyl ortho-benzoyl-benzoate:ethyl acrylate copolymer.

9. A photosensitive coating system comprising a solid substrate coated on at least one surface thereof with a coating comprising a (2-hydroxy-3-methacryloxy)propoxy para-benzoyl-benzene:methyl acrylate copolymer.

10. A photosensitive coating system comprising a solid substrate coated on at least one surface thereof with a coating comprising a (2-hydroxy-3-methacryloxy)propyl ortho - (p'-methyl-benzoyl)benzoate:ethyl acrylate copolymer.

11. A photosensitive coating system comprising a solid substrate coated on at least one surface thereof with a coating comprising a (2-hydroxy-3-acryloxy)propyl para-benzoyl benzoate:methyl acrylate copolymer.

12. A photosensitive coating system comprising a solid substrate coated on at least one surface thereof with a coating comprising a (2-hydroxy-3-acryloxy)propyl para-benzoyl benzoate:ethyl acrylate copolymer.

13. A photosensitive coating system comprising a solid substrate coated on at least one surface thereof with a coating comprising a (2-hydroxy-3-acryloxy)propyl para-benzoyl benzoate:isobutyl methacrylate copolymer.

14. A photosensitive coating system comprising a solid substrate coated on at least one surface thereof with a coating comprising a (2-hydroxy-3-acryloxy)propyl para-benzoyl benzoate:n-butyl acrylate copolymer.

15. A process for producing printing plates by the photochemical crosslinking of a polymeric material whereby a photosensitive coating system is exposed to actinic radiation through an image bearing transparency comprising substantially opaque and transparent areas; said photosensitive coating system comprising a solid substrate coated on at least one surface thereof with a coating composition comprising a copolymer containing moieties derived from at least one vinyl monomer and at least one ethylenically unsaturated derivative of a substituted benzophenone selected from the group consisting of:

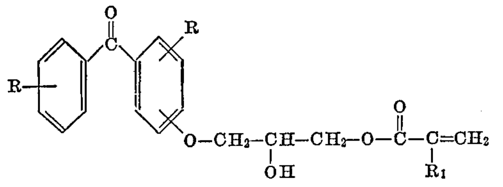

and

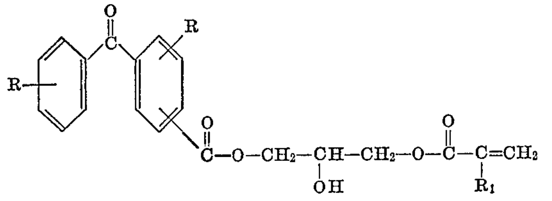

wherein R is a radical selected from the group consisting of the hydrogen, alkyl and aryl radicals and $R_1$ is a radical selected from the group consisting of the hydrogen and methyl radicals; said copolymer coating being crosslinked to an insoluble state in those areas therein which are exposed to the actinic radiation through the transparent areas of the image bearing transparency; and, thereafter removing the non-exposed, uncrosslinked areas of the copolymer coating from the surface of said substrate, the thus removed areas of the copolymer coating corresponding to the opaque areas of the image bearing transparency.

16. The process of claim 15, wherein said ethylenically unsaturated derivative of a substituted benzophenone is selected from the group consisting of:
(2-hydroxy-3-methacryloxy)propyl ortho-benzoylbenzoate;
(2-hydroxy-3-acryloxy)propyl ortho-benzoylbenzoate;
(2-hydroxy-3-methacryloxy)propyl para-benzoylbenzoate;
(2-hydroxy-3-acryloxy)propyl para-benzoylbenzoate;
(2-hydroxy-3-methacryloxy)propoxy ortho-benzoylbenzene;
(2-hydroxy-3-acryloxy)propoxy ortho-benzoylbenzene;
(2-hydroxy-3-methacryloxy)propoxy para-benzoylbenzene;
(2-hydroxy-3-acryloxy)propoxy para-benzoylbenzene;
(2-hydroxy-3-methacryloxy)propyl ortho-(o'-methylbenzoyl)benzoate;
(2-hydroxy-3-acryloxy)propyl ortho-(o'-methylbenzoyl)benzoate;
(2-hydroxy-3-methacryloxy)propyl ortho-(m'-methylbenzoyl)benzoate;
(2-hydroxy-3-acryloxy)propyl ortho-(m'-methylbenzoyl)benzoate;
(2-hydroxy-3-methacryloxy)propyl ortho-(p'-methylbenzoyl)benzoate;
(2-hydroxy-3-acryloxy)propyl ortho-(p'-methylbenzoyl)benzoate;
(2-hydroxy-3-methacryloxy)propoxy para-(o'-methylbenzoyl)benzene;
(2-hydroxy-3-acryloxy)propoxy para-(o'-methylbenzoyl)benzene;
(2-hydroxy-3-methacryloxy)propoxy para-(m'methylbenzoyl)benzene;
(2-hydroxy-3-acryloxy)propoxy para-(m'-methylbenzoyl)benzene;
(2-hydroxy-3-methacryloxy)propoxy para-(p'-methylbenzoyl)benzene;
(2-hydroxy-3-acryloxy)propoxy para-(p'-methylbenzoyl)benzene;
(2-hydroxy-3-methacryloxy)propyl ortho-benzoyl-paramethylbenzoate;
(2-hydroxy-3-acryloxy)propyl ortho-benzoyl-paramethylbenzoate;
(2-hydroxy-3-methacryloxy)propoxy ortho-methyl-parabenzoylbenzene; and
(2-hydroxy-3-acryloxy)propoxy ortho-methyl-parabenzoylbenzene.

17. The process of claim 15, wherein said copolymer contains from about 0.1 to 50%, by weight, of moieties derived from at least one of said ethylenically unsaturated derivatives of a substituted benzophenone.

18. The process of claim 15, wherein said vinyl monomer is selected from the group consisting of styrene, alpha-methyl styrene, the acrylic and methacrylic esters of aliphatic alcohols, acrylic acid, methacrylic acid, isoprene, acrylamide, methacrylamide, acrylonitrile, methacrylonitrile, butadiene, vinyl propionate, dibutyl fumarate, dibutyl maleate, diallyl phthalate, vinylidene chloride, vinyl chloride, vinyl fluoride, and vinyl acetate.

19. The process of claim 15, wherein a photosensitizer is present in said coating composition in a concentration of from about 0.01 to 10%, by weight, of the copolymer resin solids.

20. A process for chemically milling a metallic substrate by the photochemical crosslinking of a polymeric material, said process comprising: (1) the application to both surfaces of a metallic substrate of a coating composition comprising a copolymer containing moieties derived from at least one vinyl monomer and at least one ethylenically unsaturated derivative of a substituted benzophenone selected from the group consisting of:

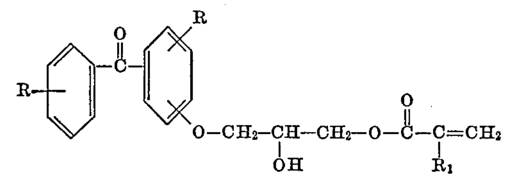

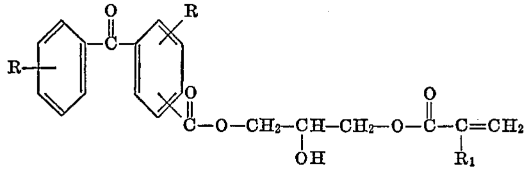

wherein R is a radical selected from the group consisting of the hydrogen, alkyl and aryl radicals and $R_1$ is a radical selected from the group consisting of the hydrogen and methyl radicals; (2) thereafter exposing both surfaces of the thus coated metallic substrate to actinic radiation through identical image bearing transparencies comprising substantially opaque and transparent areas; said copolymer coating thus being crosslinked to an insoluble state in those areas therein which are exposed to the actinic radiation through the transparent area of the image bearing transparency; (3) thereafter, removing the non-exposed, uncrosslinked areas of the copolymer coating from both surfaces of said metallic substrate; and (4) then completely dissolving away those areas of the metallic substrate which are not protected by the crosslinked copolymer coating; the latter areas corresponding to the opaque areas of the image bearing transparency.

21. The process of claim 20, wherein said ethylenically unsaturated derivative of a substituted benzophenone is selected from the group consisting of:

(2-hydroxy-3-methacryloxy)propyl ortho-benzoylbenzoate;
(2-hydroxy-3-acryloxy)propyl ortho-benzoylbenzoate;
(2-hydroxy-3-methacryloxy)propyl para-benzoylbenzoate;
(2-hydroxy-3-acryloxy)propyl para-benzoylbenzoate;
(2-hydroxy-3-methacryloxy)propoxy ortho-benzoylbenzene;
(2-hydroxy-3-acryloxy)propoxy ortho-benzoylbenzene;
(2-hydroxy-3-methacryloxy)propoxy para-benzoylbenzene;
(2-hydroxy-3-acryloxy)propoxy para-benzoylbenzene;
(2-hydroxy-3-methacryloxy)propyl ortho-(o′-methylbenzoyl)benzoate;
(2-hydroxy-3-acryloxy)propyl ortho-(o′-methylbenzoyl)benzoate;
(2-hydroxy-3-methacryloxy)propyl ortho-(m′-methylbenzoyl)benzoate;
(2-hydroxy-3-acryloxy)propyl ortho-(m′-methylbenzoyl)benzoate;
(2-hydroxy-3-methacryloxy)propyl ortho-(p′-methylbenzoyl)benzoate;
(2-hydroxy-3-acryloxy)propyl ortho-(p′-methylbenzoyl)benzoate;
(2-hydroxy-3-methacryloxy)propoxy para-(o′-methylbenzoyl)benzene;
(2-hydroxy-3-acryloxy)propoxy para-(o′-methylbenzoyl)benzene;
(2-hydroxy-3-methacryloxy)propoxy para-(m′-methylbenzoyl)benzene;
(2-hydroxy-3-acryloxy)propoxy para-(m′-methylbenzoyl)benzene;
(2-hydroxy-3-methacryloxy)propoxy para-(p′-methylbenzoyl)benzene;
(2-hydroxy-3-acryloxy)propoxy para-(p′-methylbenzoyl)benzene;
(2-hydroxy-3-methacryloxy)propyl ortho-benzoyl-para-methylbenzoate;
(2-hydroxy-3-acryloxy)propyl ortho-benzoyl-para-methylbenzoate;
(2-hydroxy-3-methacryloxy)propoxy ortho-methyl-para-benzoylbenzene; and
(2-hydroxy-3-acryloxy)propoxy ortho-methyl-para-benzoylbenzene.

22. The process of claim 20, wherein said copolymer contains from about 0.1 to 50%, by weight, of moieties derived from at least one of said ethylenically unsaturated derivatives of a substituted benzophenone.

23. The process of claim 20, wherein said vinyl monomer is selected from the group consisting of styrene, alpha-methyl styrene, the acrylic and methacrylic esters of aliphatic alcohols, acrylic acid, methacrylic acid, isoprene, acrylamide, methacrylamide, acrylonitrile, methacrylonitrile, butadiene, vinyl propionate, dibutyl fumarate, dibutyl maleate, diallyl phthalate, vinylidene chloride, vinyl chloride, vinyl fluoride, and vinyl acetate.

24. The process of claim 20, wherein a photosensitizer is present in said coating composition in a concentration of from about 0.01 to 10%, by weight, of the copolymer resin solids.

References Cited

UNITED STATES PATENTS

| | | | |
|---|---|---|---|
| 2,831,768 | 4/1958 | Merrill et al. | 96—115 |
| 3,202,094 | 8/1965 | Smallman | 96—36.2X |
| 3,222,173 | 12/1965 | Belko et al. | 96—36.2X |
| 3,429,852 | 2/1969 | Skoultchi | 260—47 |

RONALD H. SMITH, Primary Examiner

U.S. Cl. X.R.

96—36, 115, 33